US008063469B2

(12) United States Patent
Barth et al.

(10) Patent No.: US 8,063,469 B2
(45) Date of Patent: Nov. 22, 2011

(54) ON-CHIP RADIO FREQUENCY SHIELD WITH INTERCONNECT METALLIZATION

(75) Inventors: Hans-Joachim Barth, Munich (DE); Heinrich Koerner, Bruckmuehl (DE); Thorsten Meyer, Regensburg (DE); Markus Brunnbauer, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 468 days.

(21) Appl. No.: 12/242,556

(22) Filed: Sep. 30, 2008

(65) Prior Publication Data
US 2010/0078777 A1    Apr. 1, 2010

(51) Int. Cl.
*H01L 23/552*   (2006.01)
*H01L 21/44*   (2006.01)

(52) U.S. Cl. ...................................................... 257/659

(58) Field of Classification Search .................. 257/659, 257/691, E23.114, 728, 593, 661, 678, 692, 257/698, 773, 449, E21.487, 310–311, 374, 257/389, 410, 411, 547, 491, 758, E21.502; 438/458, 460, 462, 928, 465, 652
See application file for complete search history.

(56) References Cited

U.S. PATENT DOCUMENTS

| | | | |
|---|---|---|---|
| 5,202,754 A | 4/1993 | Bertin et al. | |
| 5,272,098 A * | 12/1993 | Smayling et al. | |
| 5,955,789 A | 9/1999 | Vendramin | |
| 6,022,791 A * | 2/2000 | Cook et al. | 438/458 |
| 6,486,534 B1 | 11/2002 | Sridharan et al. | |
| 6,548,391 B1 | 4/2003 | Ramm et al. | |
| 6,618,267 B1 | 9/2003 | Dalal et al. | |
| 6,686,649 B1 | 2/2004 | Mathews et al. | |
| 6,947,295 B2 | 9/2005 | Hsieh | |
| 6,998,712 B2 * | 2/2006 | Okada et al. | 257/758 |
| 7,033,927 B2 | 4/2006 | Cohen et al. | |
| 7,049,682 B1 | 5/2006 | Mathews et al. | |
| 7,336,221 B2 * | 2/2008 | Matsuo et al. | 342/175 |
| 7,427,803 B2 | 9/2008 | Chao et al. | |
| 7,550,850 B2 * | 6/2009 | Nakashiba | 257/758 |
| 7,619,297 B2 | 11/2009 | Wang | |
| 7,936,052 B2 | 5/2011 | Barth et al. | |
| 7,948,064 B2 | 5/2011 | Barth et al. | |
| 2001/0052645 A1 * | 12/2001 | Eynde et al. | |
| 2002/0167071 A1 * | 11/2002 | Wang | 257/620 |
| 2003/0003724 A1 | 1/2003 | Uchiyama et al. | |
| 2004/0178500 A1 * | 9/2004 | Usui | 257/734 |
| 2004/0195591 A1 | 10/2004 | Gehman et al. | |
| 2005/0135727 A1 | 6/2005 | Piede et al. | |
| 2005/0218465 A1 * | 10/2005 | Cummins | 257/414 |
| 2005/0233581 A1 | 10/2005 | Soejima et al. | |
| 2006/0027934 A1 | 2/2006 | Edelstein et al. | |
| 2006/0186513 A1 * | 8/2006 | Kitaguchi | 257/659 |

(Continued)

FOREIGN PATENT DOCUMENTS
DE    10 2004 022 884 A1    12/2005

*Primary Examiner* — Dao H Nguyen
*Assistant Examiner* — Tram H Nguyen
(74) *Attorney, Agent, or Firm* — Slater & Matsil, L.L.P.

(57) ABSTRACT

Structure and method for fabricating a system on chip with an on-chip RF shield including interconnect metallization is described. In one embodiment, the system on chip includes an RF circuitry disposed on a first portion of a top surface of a substrate, and a semiconductor circuitry disposed on a second portion of the top surface of the substrate. An interconnect RF barrier is disposed between the RF circuitry and the semiconductor circuitry, the interconnect RF barrier coupled to a ground potential node.

24 Claims, 18 Drawing Sheets

U.S. PATENT DOCUMENTS

| | | |
|---|---|---|
| 2006/0192265 A1* | 8/2006 | Hsu .......................... 257/499 |
| 2006/0197214 A1* | 9/2006 | Chen ......................... 257/688 |
| 2006/0220178 A1 | 10/2006 | Kubo et al. |
| 2006/0229683 A1 | 10/2006 | Wang et al. |
| 2007/0262422 A1 | 11/2007 | Bakalski et al. |
| 2007/0281438 A1 | 12/2007 | Liu et al. |
| 2008/0064189 A1 | 3/2008 | Daubenspeck et al. |
| 2008/0073752 A1 | 3/2008 | Asai et al. |
| 2008/0079168 A1* | 4/2008 | Barth ......................... 257/773 |
| 2008/0128888 A1* | 6/2008 | Park et al. .................. 257/691 |
| 2008/0157341 A1 | 7/2008 | Yang et al. |
| 2010/0078771 A1 | 4/2010 | Barth et al. |
| 2010/0078778 A1 | 4/2010 | Barth et al. |
| 2011/0201175 A1 | 8/2011 | Barth et al. |

* cited by examiner

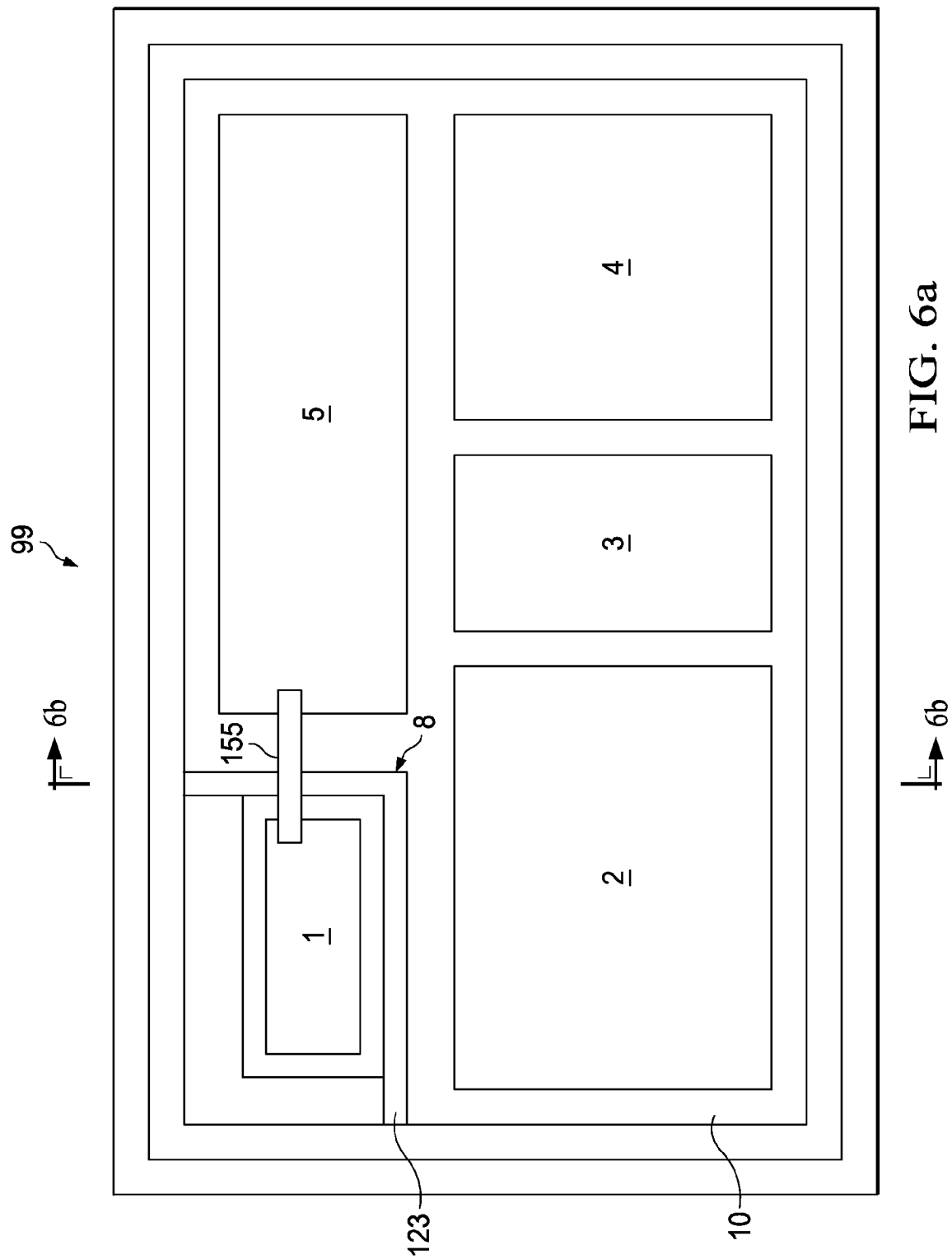

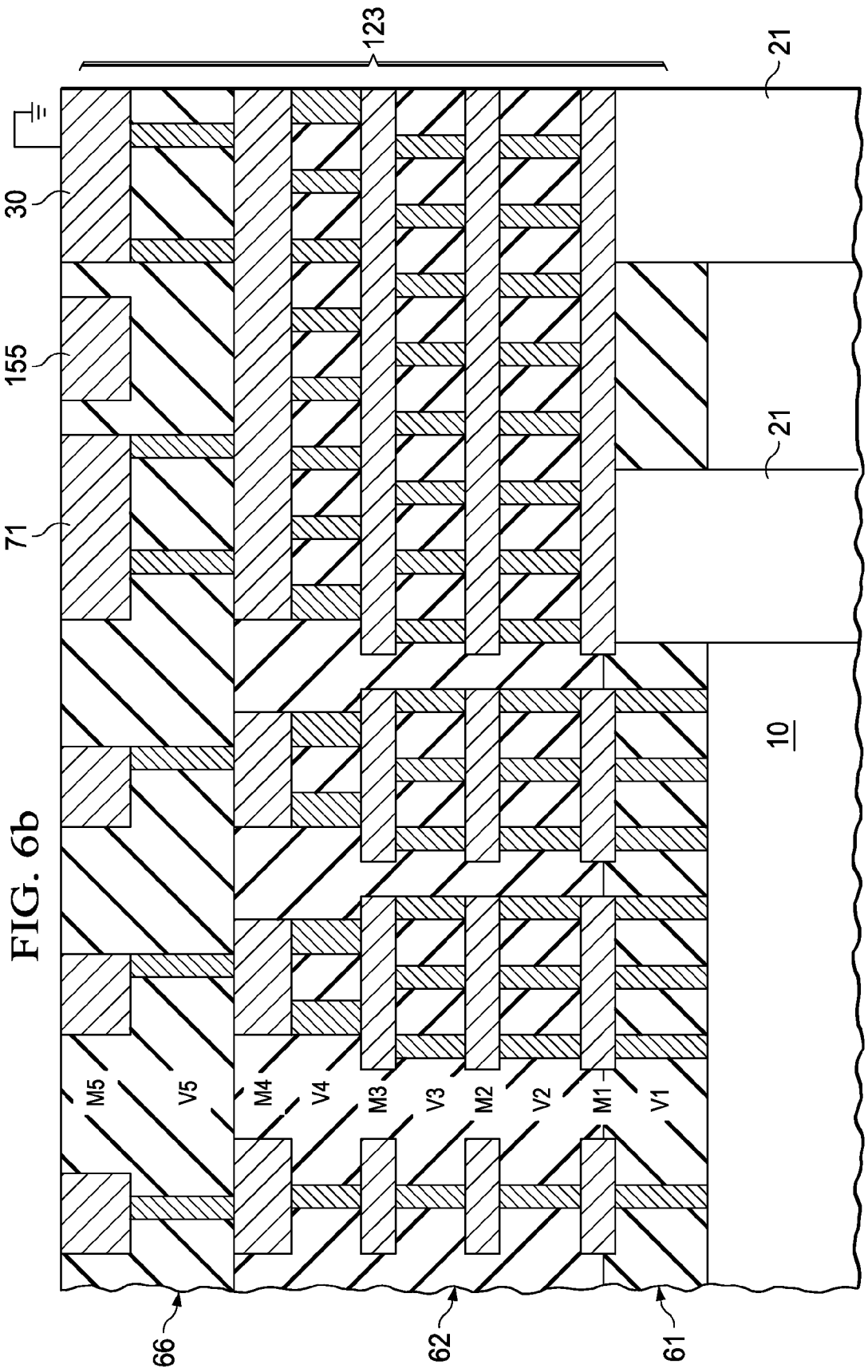

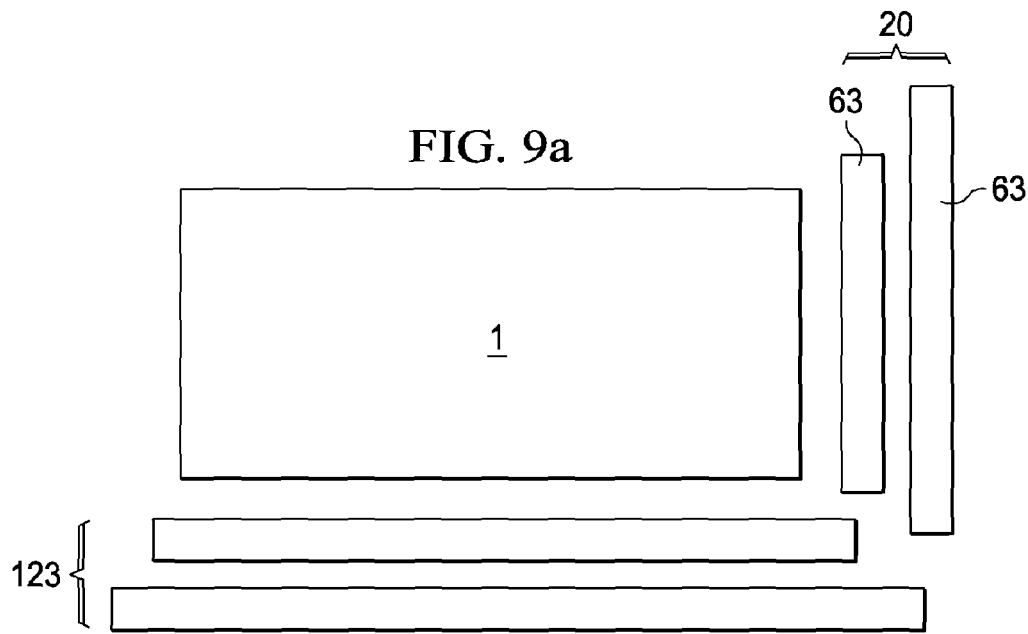
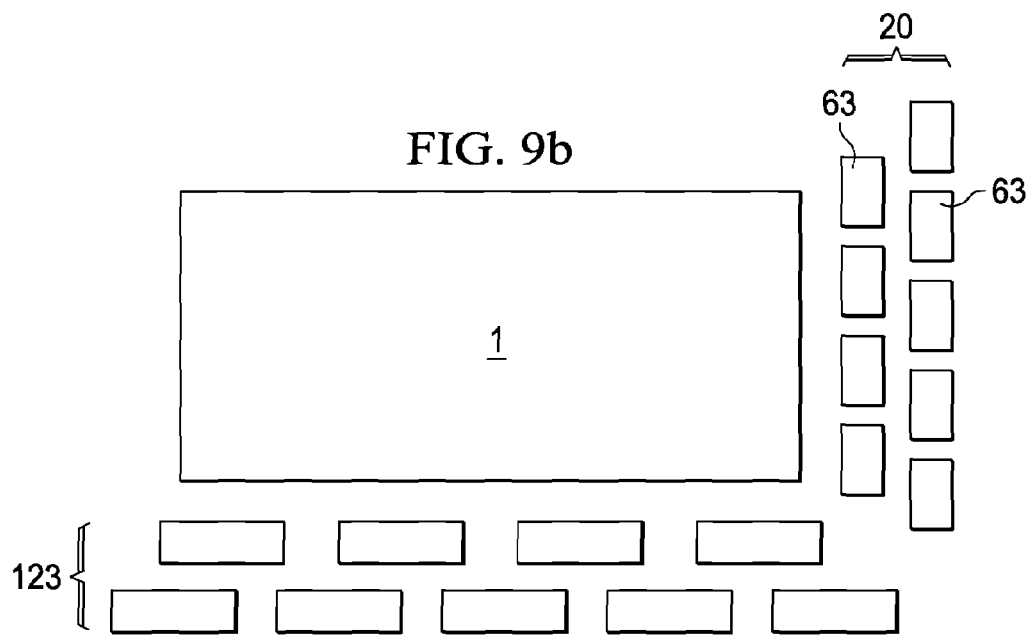

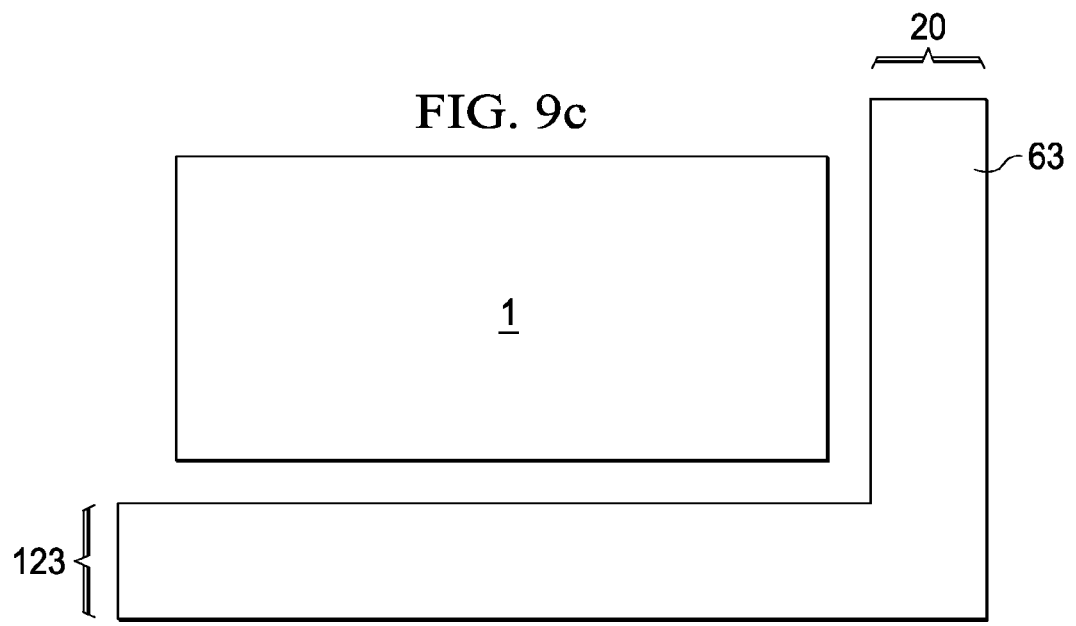
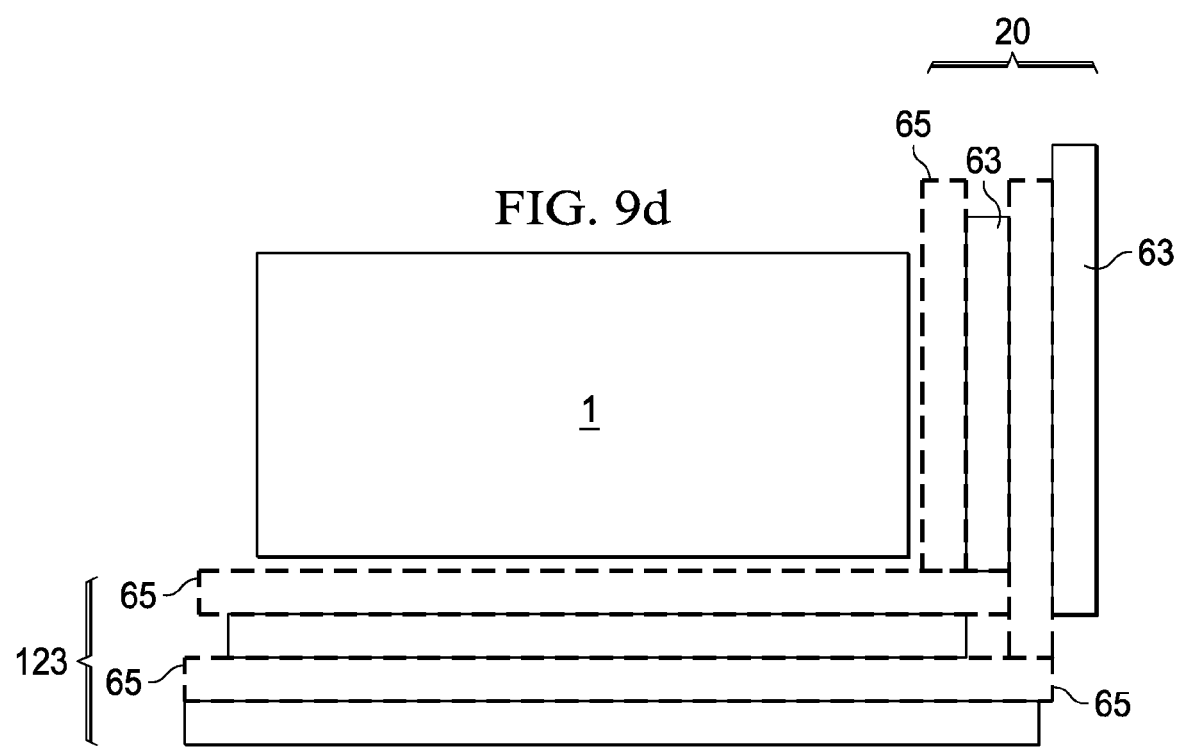

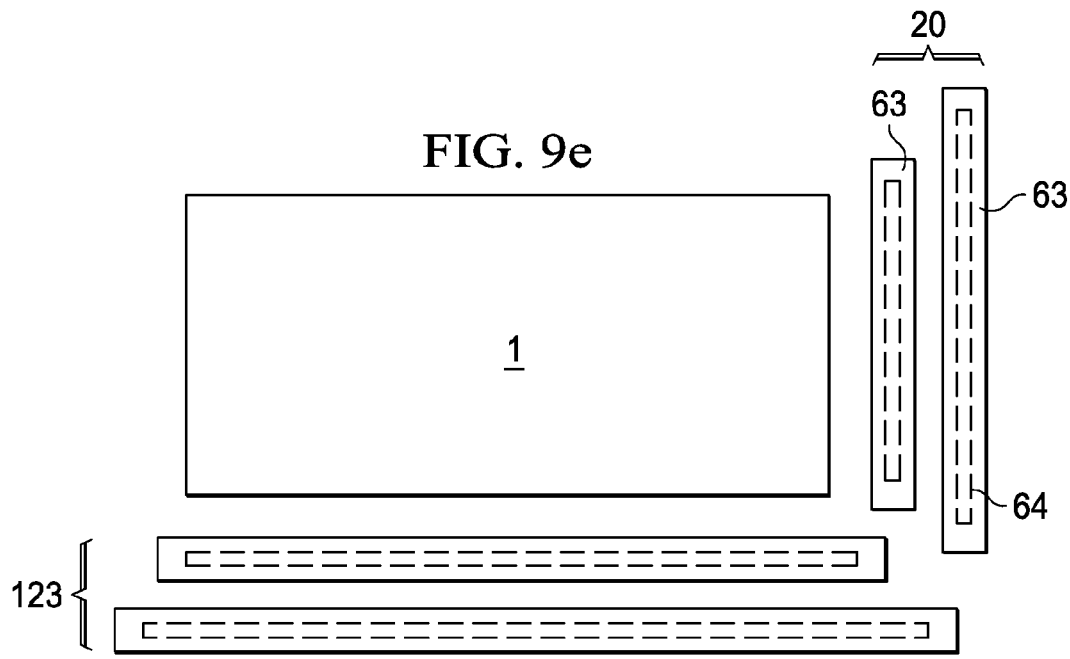
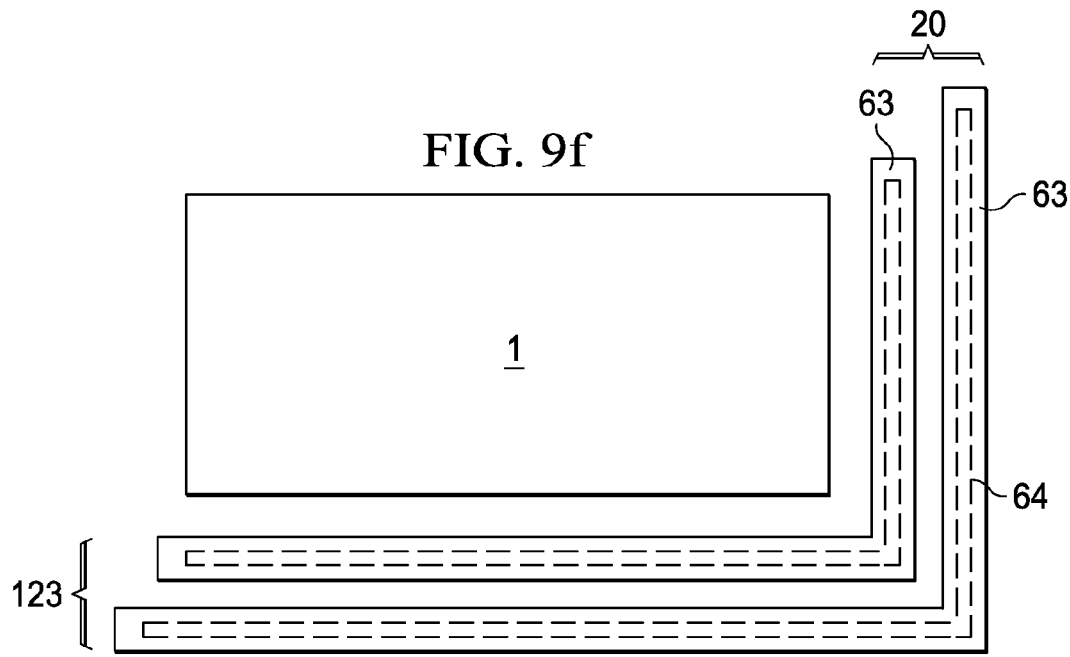

ON-CHIP RADIO FREQUENCY SHIELD WITH INTERCONNECT METALLIZATION

CROSS-REFERENCE TO RELATED APPLICATIONS

This patent application relates to the following commonly assigned co-pending applications concurrently filed, each of which is hereby incorporated herein by reference:

| Patent Number | Serial Number | Filing Date | Issue Date | Attorney docket number |
|---|---|---|---|---|
| | | | | INF 2008 P 50667 US |
| | | | | INF 2008 P 50668 US |
| | | | | INF 2008 P 50669 US |
| | | | | INF 2008 P 50762 US |

TECHNICAL FIELD

The present invention relates generally to a system on chip semiconductor device, and more particularly to a radio frequency shield with interconnect metallization.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a demand in semiconductor device technology to integrate many different functions on a single chip, e.g., manufacturing analog and digital circuitry on the same die. In such applications, many different components such as digital and analog or RF circuitry are integrated into a single chip. However, such integration creates additional challenges that need to be overcome. For example, integration of multiple components results in interference between various components. RF circuitry operating at high frequencies produces extraneous electromagnetic radiation that interferes with the operation of other components in the integrated system on chip. This problem deteriorates with subsequent technology generations as operating frequencies continually increase. Aggressive integration of multiple components in a single chip requires the need to eliminate such interference without a significant increase in production costs.

SUMMARY OF THE INVENTION

These and other problems are generally solved or circumvented, and technical advantages are generally achieved, by preferred embodiments of the present invention which include use of interconnect metallization to form RF shields.

Embodiments of the invention include system on chip with on-chip RF shield with interconnect metallization. In accordance with a preferred embodiment of the present invention, the system on chip comprises an RF circuitry disposed on a first portion of a top surface of a substrate and a semiconductor circuitry disposed on a second portion of the top surface of the substrate. An interconnect RF barrier is disposed between the RF circuitry and the semiconductor circuitry, the interconnect RF barrier coupled to a ground potential node.

The foregoing has outlined rather broadly the features of an embodiment of the present invention so the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which:

FIG. 1, which includes FIGS. 1a and 1b, illustrates an embodiment of the invention describing an interconnect RF barrier of a system on chip, wherein FIG. 1a illustrates a top cross section and FIG. 1b illustrates a cross sectional view;

FIG. 2, which includes FIGS. 2a-2c, illustrates an embodiment of the invention describing an interconnect RF barrier of a system on chip, wherein FIG. 2a illustrates a top cross section and FIGS. 2b and 2c illustrate cross sectional views;

FIG. 3, which includes

FIG. 5 illustrates an interconnect RF barrier, in accordance with an embodiment of the invention, wherein FIG. 5 illustrates a cross sectional view of a part of the top view illustrated in FIG. 4;

FIG. 6, which includes FIGS. 6a and 6b, illustrates an interconnect RF barrier in accordance with an embodiment of the invention describing interconnects between various components of a system on a chip, wherein FIG. 6a illustrates a top view and FIG. 6b illustrates a cross sectional view;

FIG. 7, which includes FIGS. 7a and 7b, illustrates an embodiment of the invention illustrating through substrate vias coupled with a moisture barrier, wherein FIG. 7a illustrates a top view and FIG. 7b illustrates a cross sectional view;

FIG. 8, which includes FIGS. 8a and 8b, illustrates an embodiment of the invention illustrating through substrate vias coupled with a crack stop structure, wherein FIG. 8a illustrates a top view and FIG. 8b illustrates a cross sectional view; and FIG. 9, which includes FIGS. 9a-9f, illustrates the metallization structure forming an interconnect RF barrier in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely to form RF shields comprising interconnect metallization. The invention may also be applied, however, for shielding other radiation originating from within the chip or outside the chip.

The present invention will be described with respect to preferred embodiments in a specific context, namely a structure comprising an RF shield formed from interconnect metallization layers. In various embodiments, the invention avoids the use of separate shielding layers or structures formed separately and disposed outside the chip (for example, during packaging). The present invention avoids expensive fabrication costs by integrating the RF shield on-chip rather than being separately attached to the chip. Further, being an integrated RF shield, the manufacturing steps are commonly shared with other components already being used in the fabrication of the system on chip (SoC). Although illustrated with respect to shielding adjacent components on a, SoC the invention may be applied to shielding single chips from adjacent chips.

According to SoC requirements, analog, RF, digital, and memory blocks all coexist on-chip while interacting minimally (such as generating minimal noise and being highly immune to the received noise). In particular, as operating frequencies increase with scaling, RF components operating at high GHz frequencies emit electromagnetic radiation that interferes with other neighboring components. In various embodiments of the present invention, a conductive shield formed from the back end of the line metallization layers that surrounds the RF components of a chip are used to minimize this interference. The conductive shield blocks the electromagnetic radiation generated by the RF circuitry from reaching other components of the SoC.

A structural embodiment of the invention illustrating an interconnect RF barrier formed in the interconnect metallization will be first described using FIG. 1. Further structural embodiments will be described using FIGS. 4, 5, 6, 7, 8 and 9. Embodiments of methods of fabrication of the interconnect RF barrier will be illustrated in FIG. 2 and flow charts of FIG. 3.

Figure 1A:
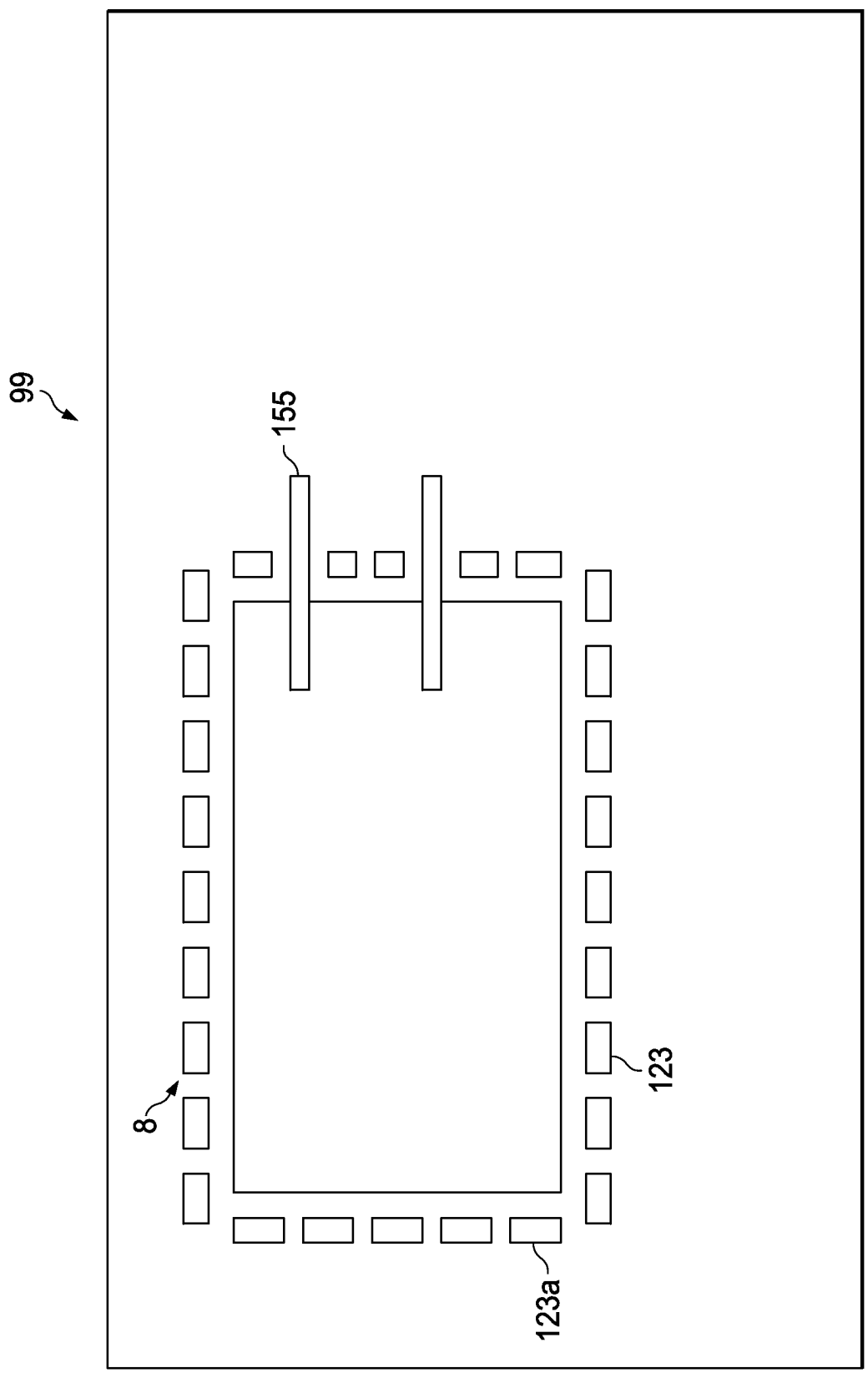
Figure 1B:
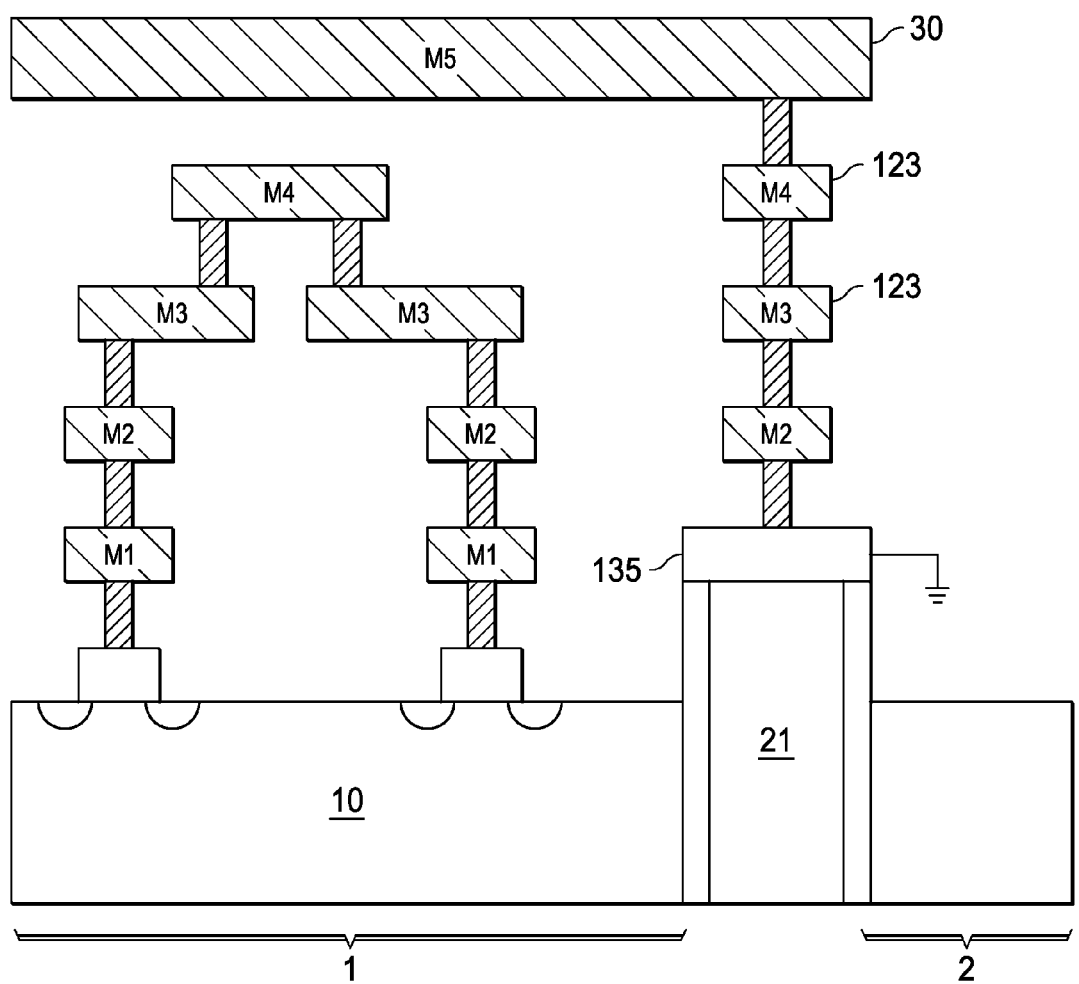

FIG. 1, which includes FIGS. 1a and 1b, illustrates an RF shield formed around an RF component disposed in a system on chip SoC 99. FIG. 1 illustrates a schematic top down view of on-chip interconnect barrier for electromagnetic radiation. In various embodiments, stacks, pillars or columns are used to form the sidewalls of an RF-shield 8. The relaxed spacing between the stacks/columns of the interconnect RF barrier 123 allows the design of on-chip interconnect wires (the component interconnects 155) to connect the RF-unit of the chip with the non-RF parts.

Referring to FIG. 1a, the interconnect RF barrier 123 is formed around an RF component 1. In one embodiment, the interconnect barrier 123 is formed along the edges (labeled as edge interconnect barrier 123a) of the SoC 99. In another embodiment, the edge interconnect RF barrier 123a is not formed along the edges of the SoC 99.

FIG. 1b illustrates a schematic cross section through parts of an RF-shield 8 built in the on-chip interconnects. FIG. 1b illustrates an RF component 1 and a semiconductor component (for example, digital logic component 2) which are separated by a through silicon via 21 coupled to an interconnect RF barrier 123. The interconnect RF barrier 123 and the through silicon via 21 form a fence 20. In various embodiments, vertical interconnect stacks, pillars or columns form the interconnect RF barrier 123 (sidewall of the RF-shield 8).

The top side of the substrate 10 includes active devices as illustrated schematically in FIG. 1b. FIG. 1b further illustrates the metallization above the substrate 10. In one embodiment, a first, a second, a third, and a fourth metal level M1, M2, M3 and M4 are used to interconnect the active devices of the system on chip SoC 99. However, in other embodiments, more or less number of metal levels is used. An upper metal level (M5) forms the top shield 30 of the RF shield 8. Horizontal metal bars or metal plates form the top cover (illustrated in the fifth metal level M5) of the RF-shield. As shown here the vertical sidewalls of the RF-shield 8 are electrically coupled to the through silicon via 21 through an M1 connection 135. Hence, all parts of the RF-shield are on the same ground potential.

Figure 2A:
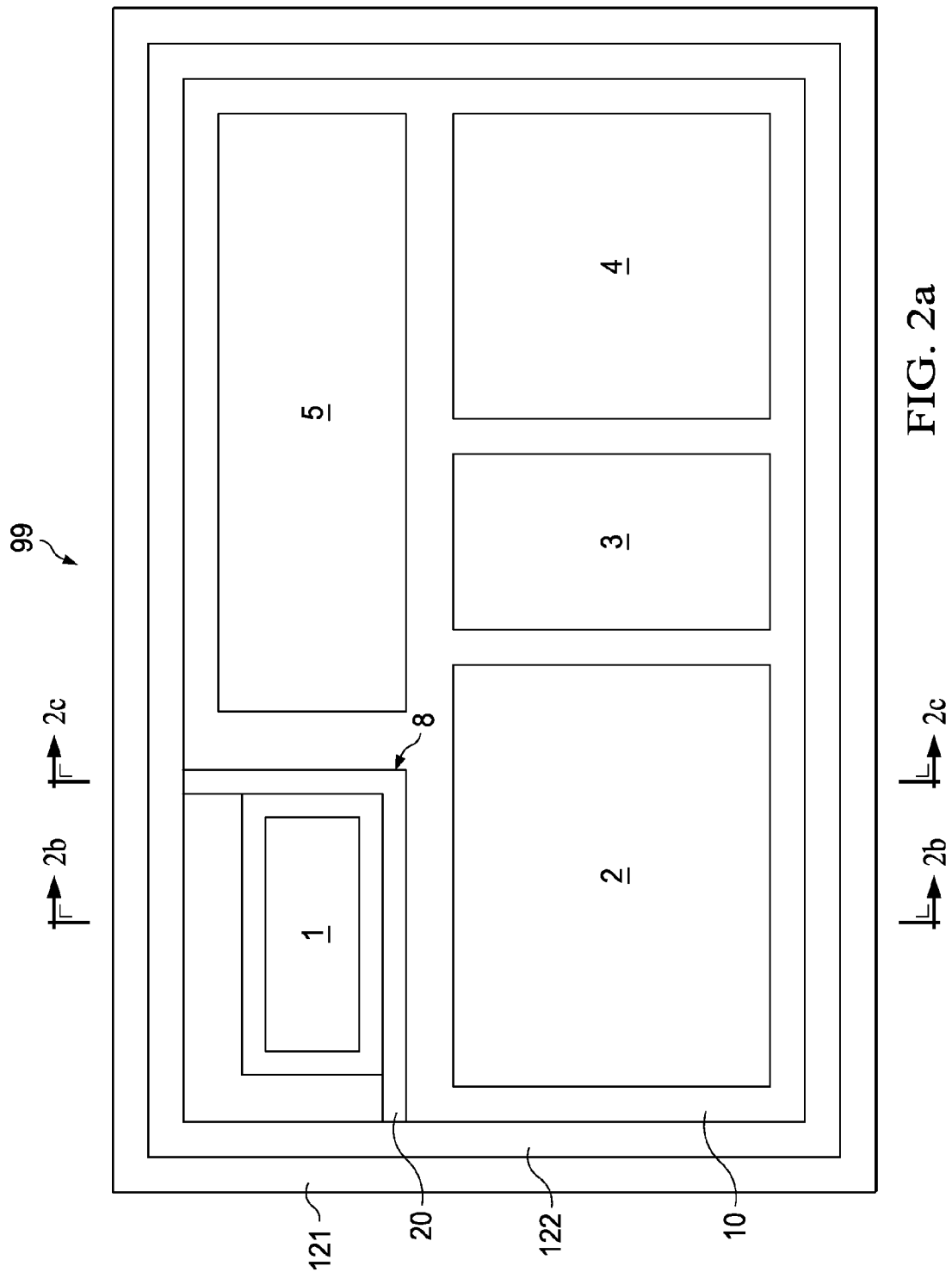
Figure 2B:
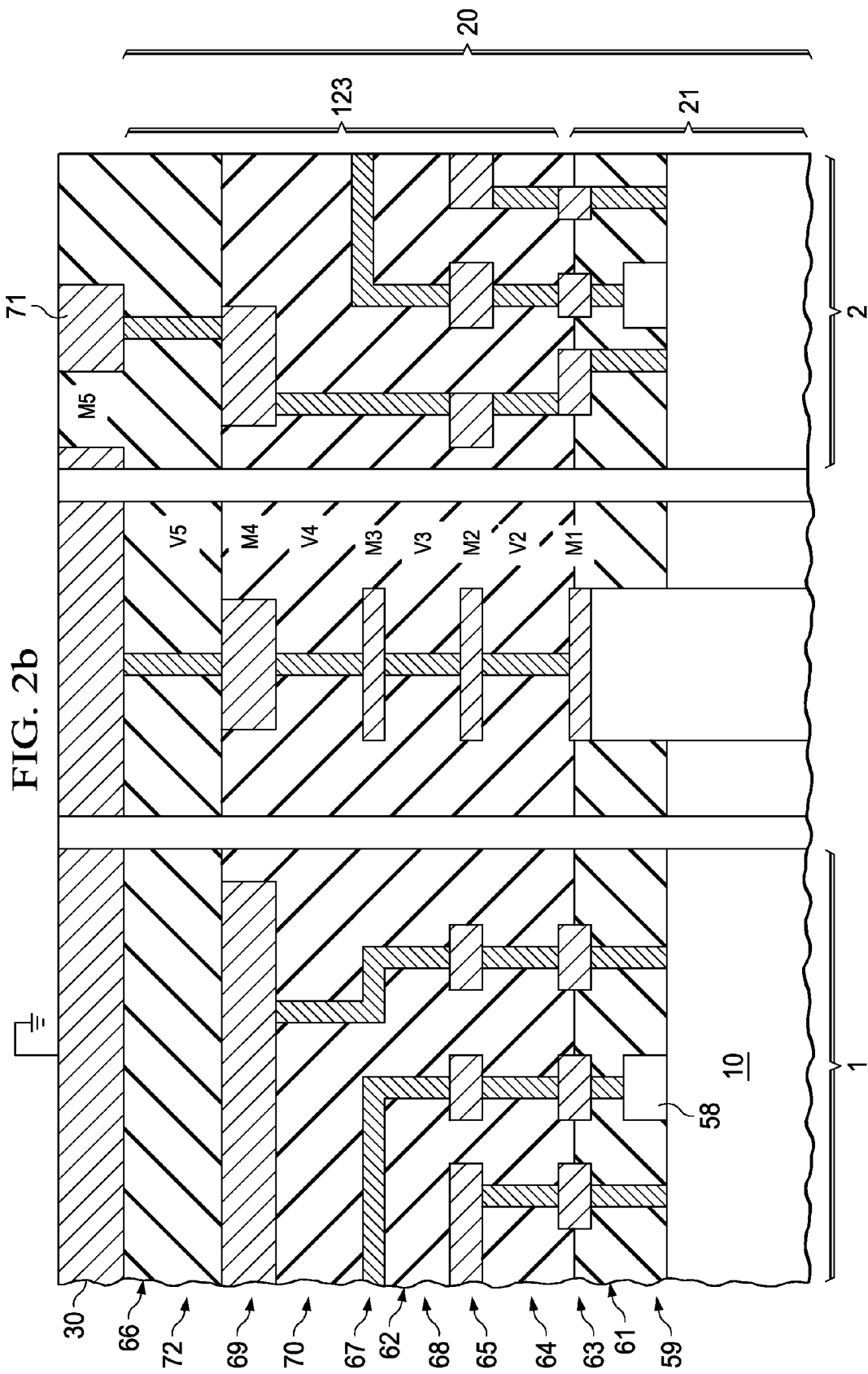
Figure 2C:
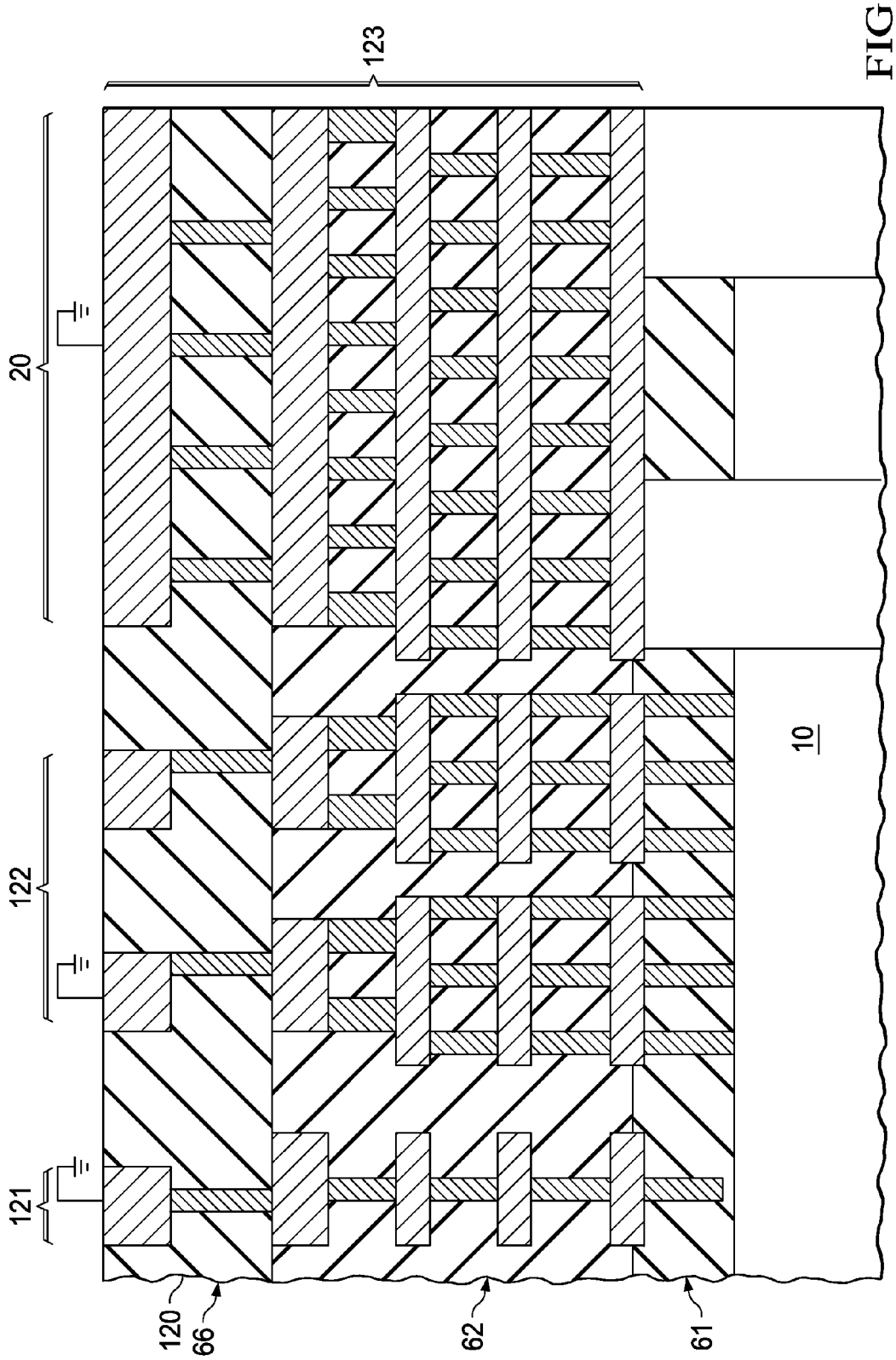

An embodiment of the invention is illustrated in FIG. 2, which includes FIGS. 2a-2c, wherein FIG. 2a illustrates a top cross section and FIGS. 2b and 2c illustrate cross sectional views.

Referring to FIG. 2a, an SoC 99 comprises an RF component 1 along with other components. In one embodiment, the SoC chip 99 comprises digital logic component 2, analog component 3, non-volatile memory 4, and SRAM component 5. In various embodiments, less or more components may be present.

In various embodiments, electromagnetic radiation emitted by the RF component 1 is shielded by the RF-shield 8. The RF-shield 8 comprises an on-chip three dimensional structure enclosing the RF component 1, and is formed as part of the SoC 99. The RF shield 8 comprises a fence 20 disposed around and above the SoC 99, in one embodiment. In various embodiments, the RF shield 8 may comprise a plate, a grid or a mesh disposed around and above the SoC 99. In various embodiments, this arrangement does not require use of additional chip area, and hence involves no additional area penalty.

In another embodiment as illustrated in FIG. 2a, a top cross sectional view, a crack stop layer 121 is formed around the SoC 99. The crack stop layer 121 is formed along the edge of the SoC 99, and adjacent a dicing channel. A moisture barrier 122 is formed between the crack stop layer 121 and the active circuitry of the SoC 99. A vertical fence 20 of the RF shield 8 is formed only along the inner boundaries of the RF component 1 as illustrated in FIG. 2. The crack stop layer 121 and the moisture barrier 122 form the RF shield along the edges and hence additional shield structure is not necessary.

Referring to FIG. 2b, the cross section illustrates the vertical fence 20 comprising an interconnect RF barrier 123 and a through substrate via 21 disposed underneath. The interconnect RF barrier 123 is disposed between the RF component 1 and a semiconductor circuitry, for example, digital logic component 2. FIG. 2b also illustrates the top shield 30 formed from the metallization layers. The top shield 30 covers the active circuitry. In particular, the top shield 30 covers the RF component 1. In various embodiments, the top shield 30 is disposed above the RF component 1 and/or around the RF component 1.

FIG. 2c, a vertical cross sectional view, illustrates the crack stop 121 and the moisture barrier 122 forming the RF-shield 8 along the outside edge of the SoC 99. As illustrated, the edge of the chip comprises the dicing kerf 120 and the crack stop layer 121 is disposed adjacent to the dicing kerf 120. In various embodiments, a crack stop layer 121 can comprise discontinuities whereas a moisture barrier 122 comprises continuous metal lines and via trenches underneath. In various embodiments, the crack stop layer 121 and the moisture barrier 122 are coupled to a ground potential node.

Referring to FIGS. 2b and 2c, the interconnect RF barrier 123 is disposed in first, second, and a third metallization insulation layers 61, 62, and 66. However, in other embodiments, more or less insulation layers are used. Further, as would be described in more detail below, each of the first, second, and third metallization insulation layers 61, 62, and 66 may comprise multiple layers. Multiple metal lines comprising first metal lines 63 ($M_1$), second metal lines 65 ($M_2$), and further metal lines ($M_3$, $M_4$ etc.) are disposed above the substrate 10, and are electrically coupled to through substrate vias 21 disposed in the substrate 10. The metal lines are connected via the contact plugs 59, first vias 64, and further vias ($V_3$, $V_4$, and $V_5$). The top shield 30 is formed on the top most metal level of the chip (fifth metal level in this illustration).

The contact plugs 59 from the first via level $V_1$ comprising a plurality of vias of different designs are disposed above the substrate 10. The contact plugs 59 are embedded in a first metallization insulation layer 61, the first metallization insulation layer 61 disposed over the substrate 10. The substrate 10 is a wafer or an oxide layer over the wafer.

The first metallization insulation layer 61 preferably comprises $SiO_2$ such as tetra ethyl oxysilane (TEOS) or fluorinated TEOS (FTEOS), but in various embodiments may comprise insulating materials typically used in semiconductor manufacturing for inter-level dielectric (ILD) layers, such as doped glass (BPSG, PSG, BSG), organo silicate glass (OSG), carbon doped oxides (CDO), fluorinated silicate glass (FSG), spin-on glass (SOG), or low-k insulating materials, e.g., having a dielectric constant of about 4 or less, or dielectric diffusion barrier layers or etchstop layers such as silicon nitride (SiN), silicon oxynitride (SiON), silicon carbide (SiC) or silicon carbo nitride (SiCN), e.g., having a dielectric constant of about 4 or higher or combinations or multiple layers thereof, as examples, although alternatively, the insulating material layer 61 may comprise other materials. The ILD may also comprise dense SiCOH or a porous dielectric having a k value of about 3 or lower, as examples. The ILD may also comprise an ultra-low-k (ULK) material having a k value of about 2.3 or lower, for example. The ILD may comprise a thickness of about 500 nm or less, for example, although alternatively, the ILD may comprise other dimensions.

The smallest pitch (distance between individual vias) of the vias is controlled by the minimum allowed spacing defined for the particular technology. Further, the pitch of the interconnect RF barrier 123 has a further constraint for effective shielding. Good shielding of electromagnetic waves is possible if the minimum distance between vias is smaller than the wavelength of the RF frequency being shielded. In one embodiment, via pitch is about 100 μm or less to shield RF frequencies up to 1000 GHz, while a pitch of about 10 mm or less is selected to shield RF frequencies up to 10 GHz. Hence, this additional constraint should not impose further burden in selecting the pitch.

The contact plugs 59 comprise an outer first conductive liner and core comprising a first conductive material. The first conductive liner comprises, for example, CVD titanium nitride and silicon doped tungsten, although in other embodiments, the first conductive liner may comprise other materials such as tantalum, tantalum nitride, titanium, titanium nitride, tungsten nitride, ruthenium or any combinations thereof and other deposition methods such as PVD or electroless deposition. The first conductive material comprises tungsten, although in other embodiments, the first conductive material may comprise other suitable materials such as copper, aluminum, tungsten, silver, gold, tantalum, titanium nitride, and ruthenium.

A second metallization insulation layer 62 is disposed above the first metallization insulation layer 61. An optional etch stop liner is present between the first and second insulation metallization insulation layers 61 and 62 (not shown). The second metallization insulation layer 62 preferably comprises a silicon dioxide or a low-k dielectric for minimizing delay arising from parasitic capacitances between vias or metal lines connecting active circuitry. The second metallization insulation layer 62 comprises a material selected from the group comprising fluorinated silicate glass (FSG), carbon doped glass (such as Black Diamond™, Coral™, Aurora™), organo silicate glass (OSG), hydrogen doped glass, porous carbon doped glass, porous silicon dioxide, polymeric dielectrics (e.g., FLARE™, SILK™, F-doped amorphous carbon, silicone based polymeric dielectrics such as hydrogen silsesquioxane (HSQ) and methylsilsesquioxane (MSQ) as well as other ultra low-k materials such as porous silicate glass, xerogel, aerogel, nano clustered silica (NCS), porous organo silicate glass, porous organics. The second metallization insulation layer 62 may either be spin-on material or deposited by techniques such as CVD. The second metallization insulation layer 62 may additionally comprise individual layers for each metal level, the individual layers in each metal level or via level separated by etch stop liners and dielectric diffusion barriers to cap the metal lines such as silicon nitride (SiN), silicon carbide (SiC), silicon carbo nitrides (SiCN) or other suitable dielectric barrier layers or combinations thereof.

The first metal level $M_1$ comprising the first metal line 63 is disposed above the contact plugs 59 and embedded in the second metallization insulation layer 62. The inner core of first metal lines 63 comprises a second conductive material and an outer second conductive liner to minimize out diffusion of the second conductive material during subsequent thermal processing. The second conductive material comprises copper, although some embodiments may comprise aluminum, tungsten, silver, gold, or other conductive materials. The outer second conductive liner comprises a diffusion barrier metal such as titanium nitride, titanium, tantalum, tantalum nitride, tungsten, tungsten nitride, tungsten carbo nitride (WCN), ruthenium or other suitable conductive materials.

First vias 64 are disposed above the first metal lines 63. The first vias 64 comprise a copper core with an outer liner preferably of tantalum nitride and tantalum, although in some embodiments the first vias 64 comprise tungsten and outer liners of titanium and titanium nitride or other metal liners or liner combinations.

As illustrated, further metal levels comprising second metal lines 65, third metal lines 67, and fourth metal lines 69 are disposed in the second metallization insulation layer 62. Second vias 68 connect the second metal lines 65 with the third metal lines 67. Third vias 70 connect the third and fourth metal lines 67 and 69.

A third metallization insulating layer 66 is disposed above the second metallization insulating layer 62. The third metallization insulating layer 66 comprises a silicon dioxide layer or a fluorinated silicon dioxide (FSG) or other less porous material. Fourth vias 73 and fifth metal lines 71 are embedded in the third metallization insulating layer 66. The third metallization insulating layer 66 is covered by a passivation layer (not shown).

The contacts or vias $V_1$, $V_2$, $V_3$, $V_4$ and $V_5$ are designed as rectangular segments (lines) in the minimum dimensions of the respective via level. However, other design variants, like arrays of circular, square or elliptical vias, may also be used at least in parts of the interconnect RF barrier 123. The via structures mentioned above may alternatively use larger dimensions than the minimum dimensions of the respective levels.

Figure 3A:
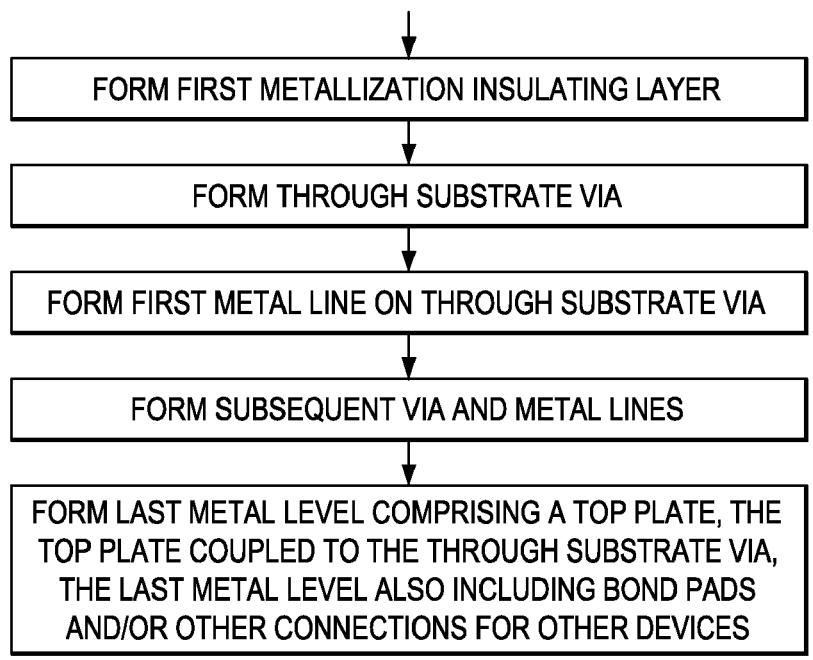
FIGS. 3a-3c, illustrates a flow chart for process steps used in various embodiments of the invention.

A method of fabrication of the interconnect RF barrier 123 is described along with the flow chart of FIG. 3.

The active circuitry comprising the active devices are fabricated in the front end of the line processing. A first metallization insulation layer 61 is deposited over the substrate 10. In this embodiment, the through trench via 21 is formed before the formation of the interconnect RF barrier 123. However, in other embodiments, the through trench via 21 is fabricated after forming the interconnect RF barrier 123.

A through substrate opening is formed through the first metallization insulation layer 61 into the substrate 10, and the opening filled with a sidewall insulating liner and a conductive fill material. The conductive fill material is planarized.

Figure 3B:
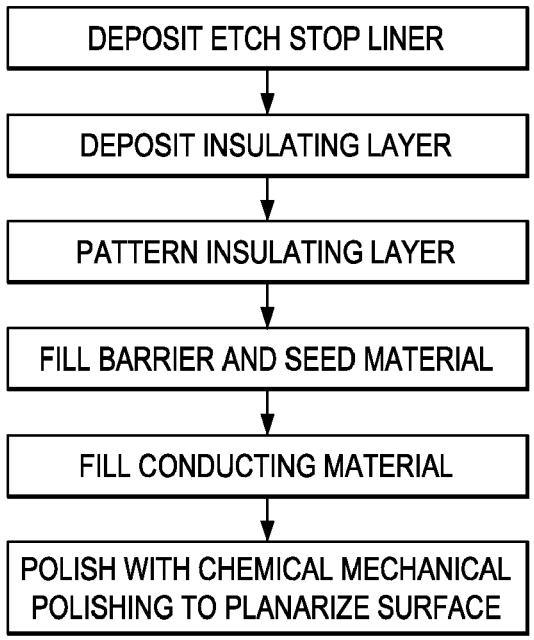
Figure 3C:
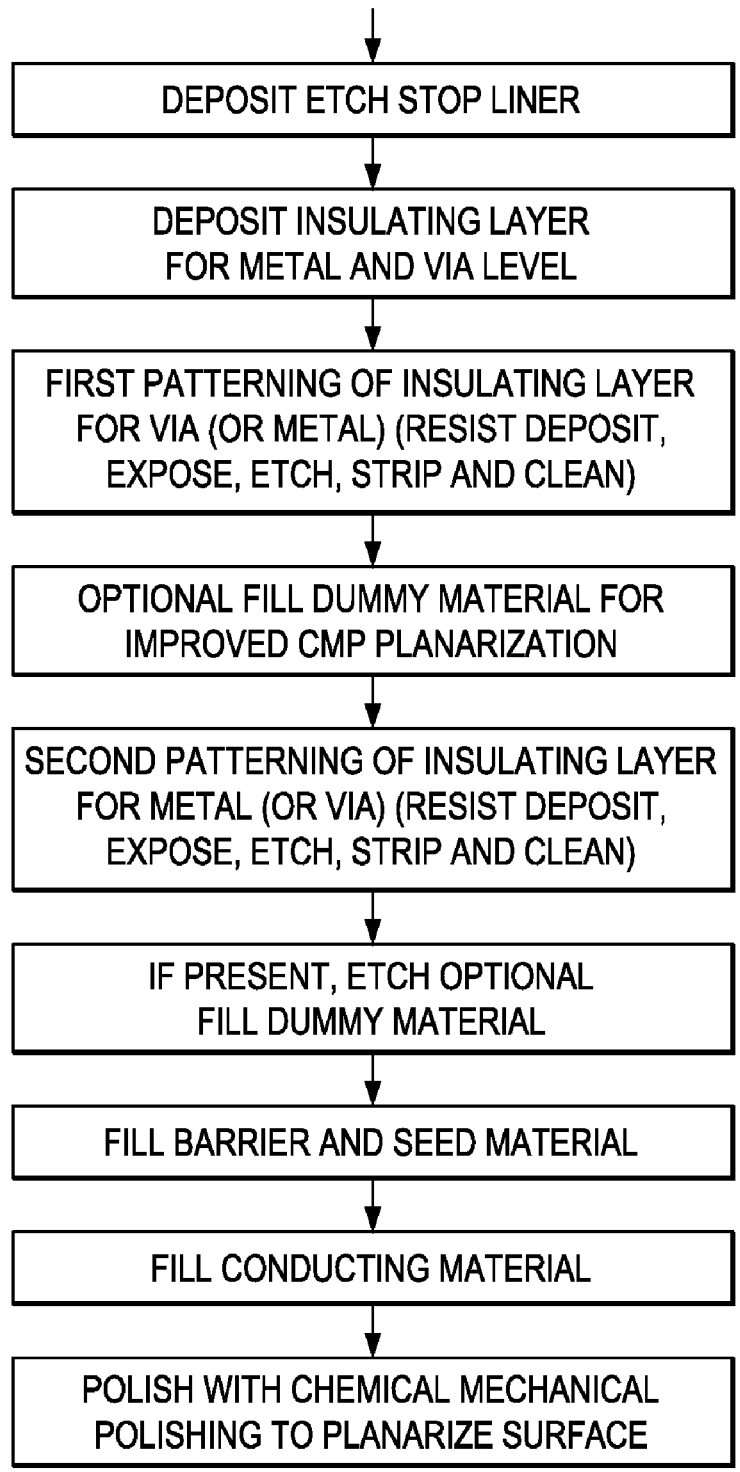

In various embodiments of the invention, the metal and via levels are formed using a single damascene process or a dual damascene process. In a single damascene process, a single layer of insulating material is patterned with a pattern for conductive features, such as conductive lines and conductive vias. In contrast, in a dual damascene process, the vias and metals lines are patterned for conductive features and filled in a single fill step with a conductive material. A flow chart illustrating formation of a single metal or via level using a single damascene process is illustrated in FIG. 3b. If a dual damascene process is used, a process as illustrated in flow chart in FIG. 3c is used.

Figure 4:
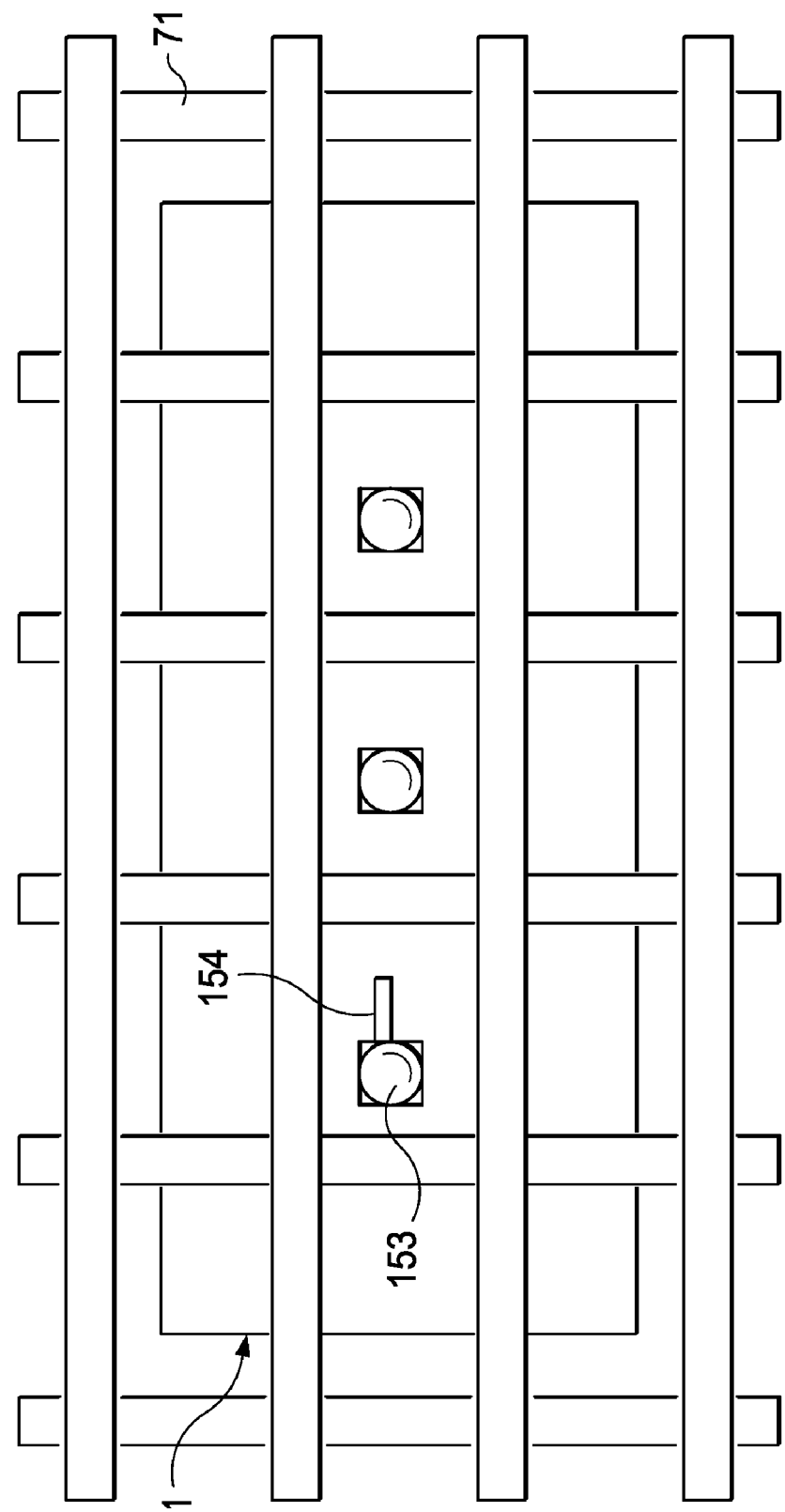
FIG. 4 illustrates a magnified top view of the RF component illustrating a top metal level of an interconnect RF barrier, in accordance with an embodiment of the invention.

FIG. 4 illustrates a magnified top view of the front side of the RF component 1 illustrating the top metal level of the RF barrier 123. The fifth metal lines 71 forming the top shield 30 form openings as well as larger gaps to allow routing of connections. The openings are used for transmitting signals within a chip or between different chips or I/O or power/ground connections. In some embodiments, connections to the back-side of the chip is provided by the through substrate vias. In one embodiment, pads for flip chip or micro bumps are disposed between the fifth metal lines 71. In various embodiments, this is possible because moderate RF frequencies, for example, frequencies up to 50 GHz, can include openings in the top shield 30 of about several mm without degrading shielding. Flip chips or micro bumps that are about 100 μm to about 500 μm in diameter are hence placed between the fifth metal lines 7 without compromising the capability of the RF shield 8. The front side (flip chip or micro bump) pads 153 in some embodiments are connected to the front side interconnect wiring, the front side interconnect vias and the front side circuitry by the front side redistribution links 154. In other embodiments the front side redistribution links 154 may also provide electrical coupling of the front side pads 153 to the back side of the RF component 1 through the front side interconnect stack and the through substrate vias.

Figure 5:
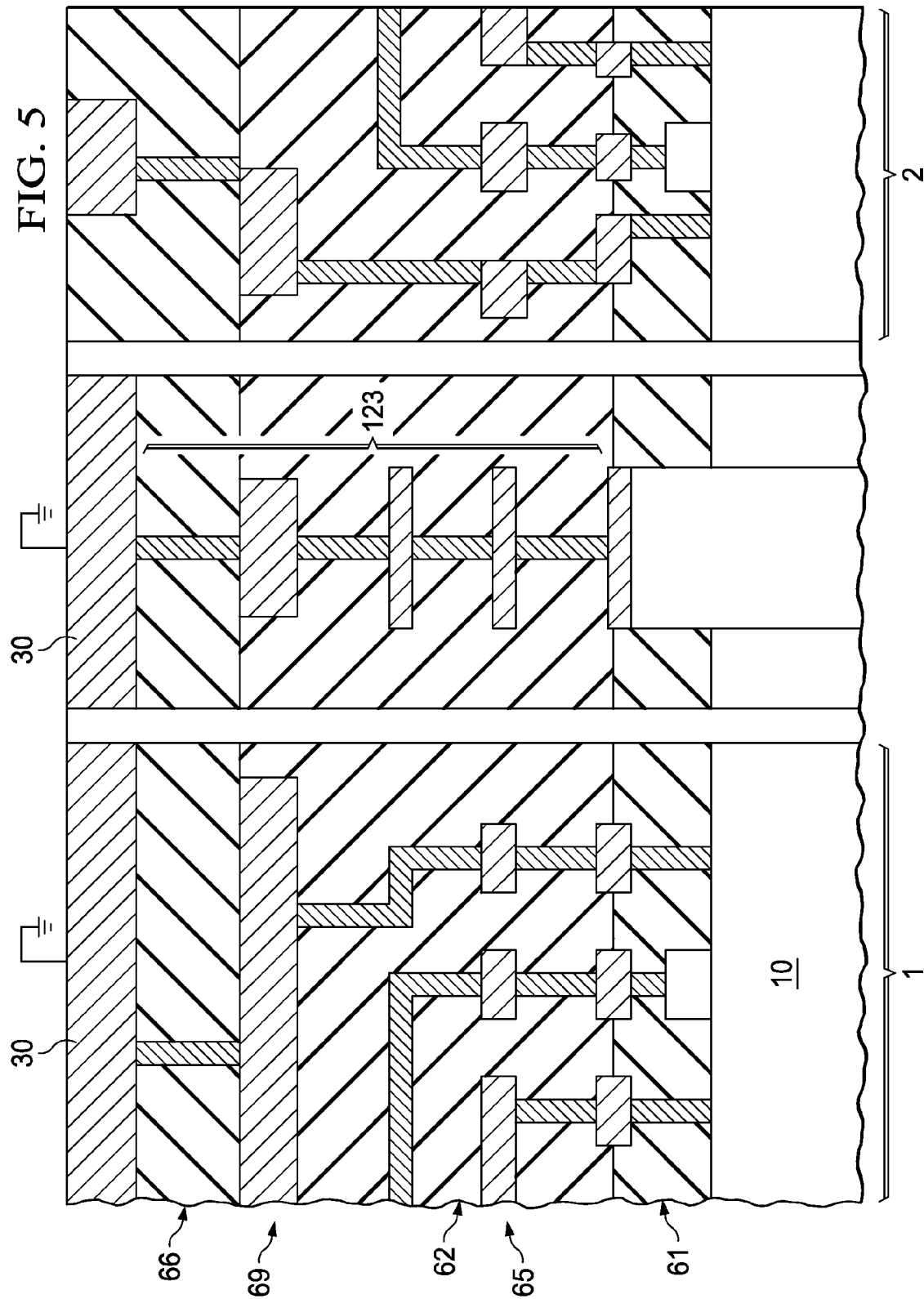

FIGS. 4 and 5 illustrate an embodiment of the invention, wherein FIG. 4 illustrates a top view and FIG. 5 illustrates a cross sectional view. As illustrated in FIG. 4, although the top shield 30 extends over the RF component 1, the top shield 30 includes openings for forming input/output connects for the active circuitry. Front side pads 153 are disposed in the openings of the top shield 30 as illustrated in FIGS. 4 and 5.

FIG. 6, which includes FIGS. 6a and 6b illustrates an embodiment of the invention illustrating interconnects between various components of the SoC 99, wherein FIG. 6a illustrates a top view and FIG. 6b illustrates a cross sectional view. As illustrated in FIG. 6a, the component interconnects 155 are formed between the RF component 1 and another semiconductor component. FIG. 6b illustrates the cross sectional view illustrating the component interconnects 155 disposed between the openings in the top shield 30. In other embodiments, one or more component interconnects 155 can also be disposed through openings in lower metal levels of the vertical part of the RF shield. These lower metal levels may comprise one or more of metal 1, metal 2, metal 3, metal 4 up to the top most metal level.

Figure 7A:
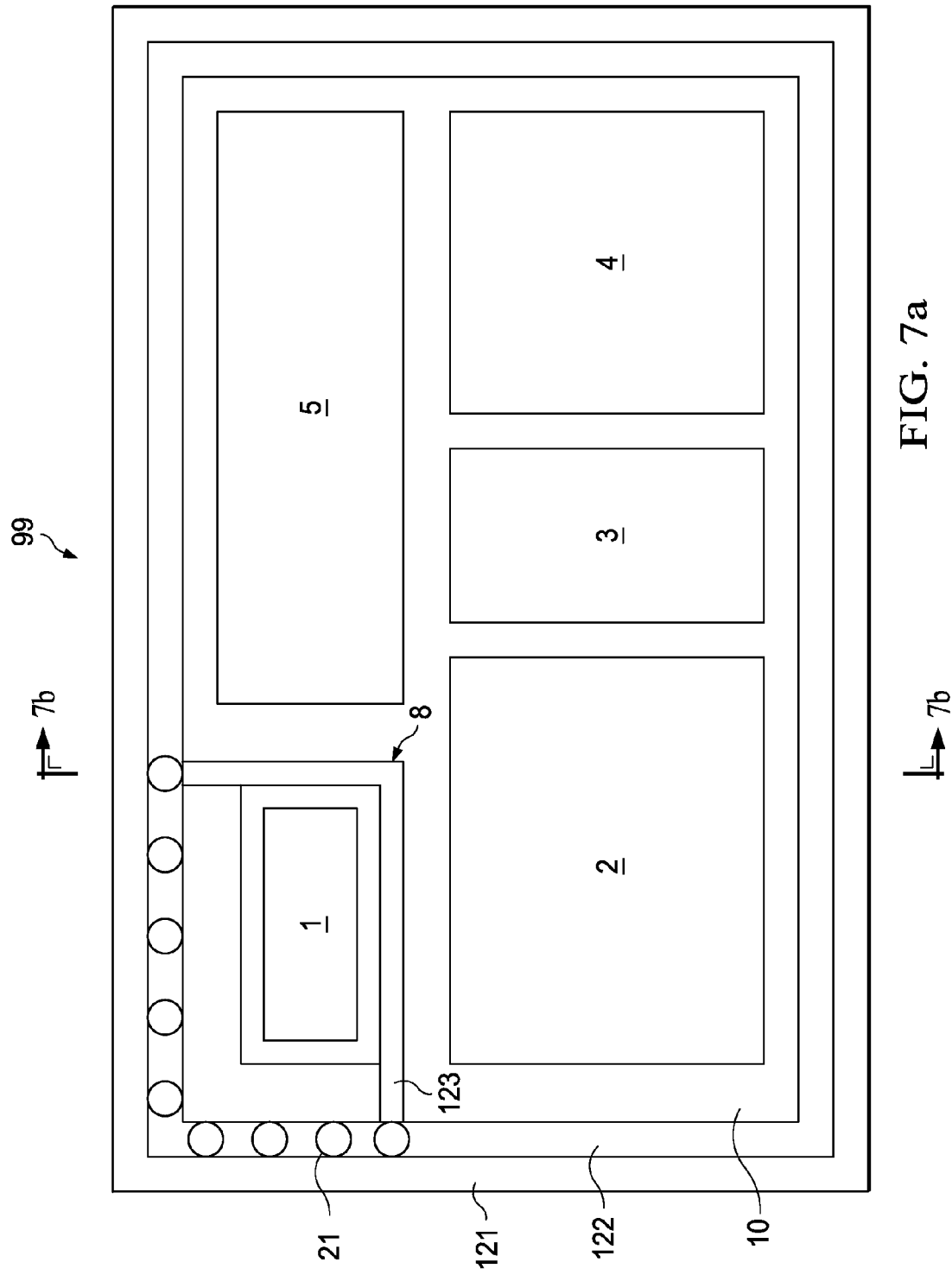
Figure 7B:
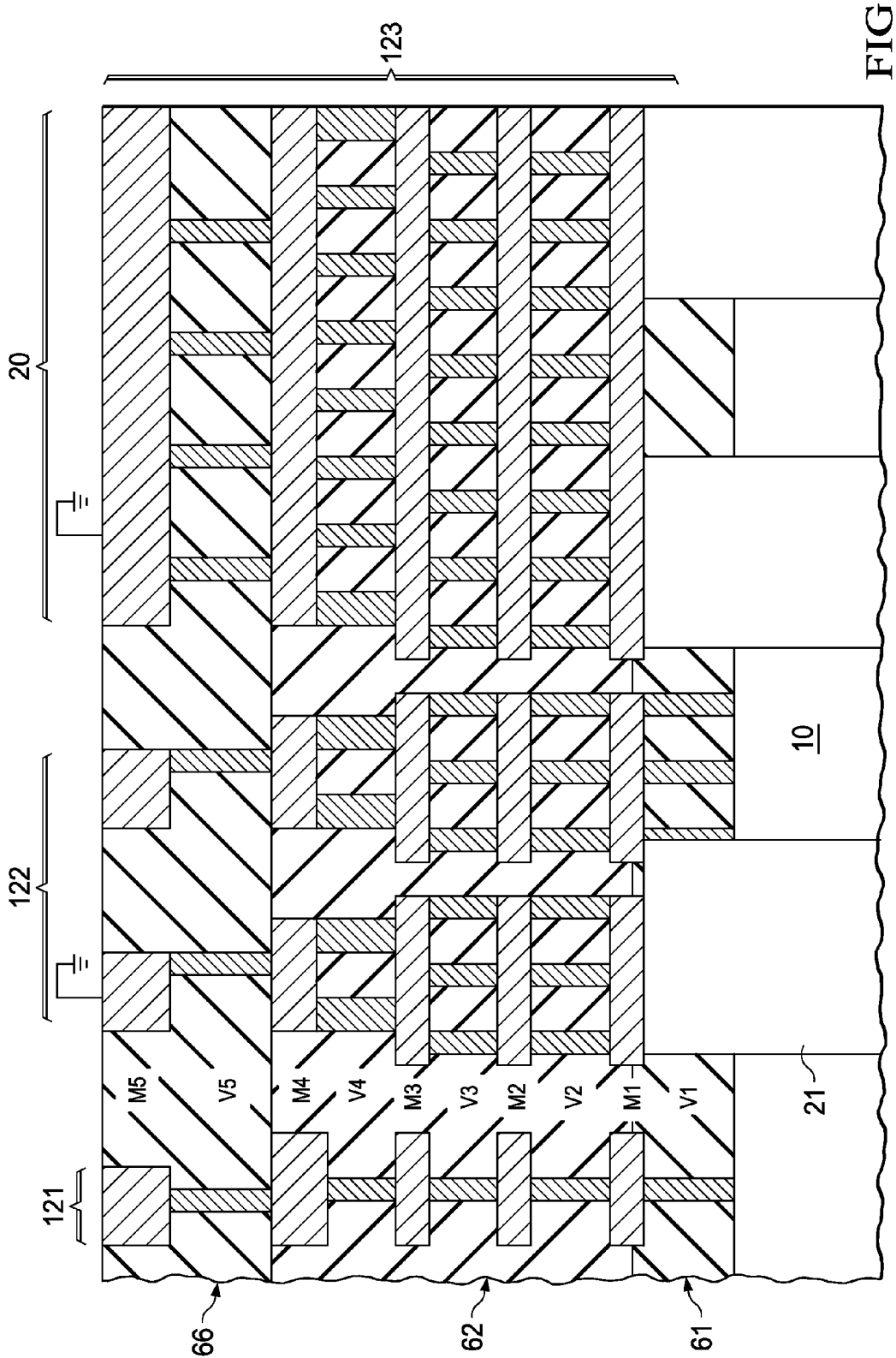

FIG. 7, which includes FIGS. 7a and 7b illustrates an embodiment of the invention illustrating through substrate vias coupled with moisture barrier 122 of the SoC 99, wherein FIG. 7a illustrates a top view and FIG. 7b illustrates a cross sectional view. As illustrated in FIG. 7a, the moisture barrier 122 around the RF component 1 is coupled to through substrate vias 21. The through substrate vias 21 are formed only adjacent the RF component 1 and not around the complete SoC 99. As illustrated the moisture barrier 122 and the interconnect RF barrier 123 are coupled to a ground potential node.

Figure 8A:
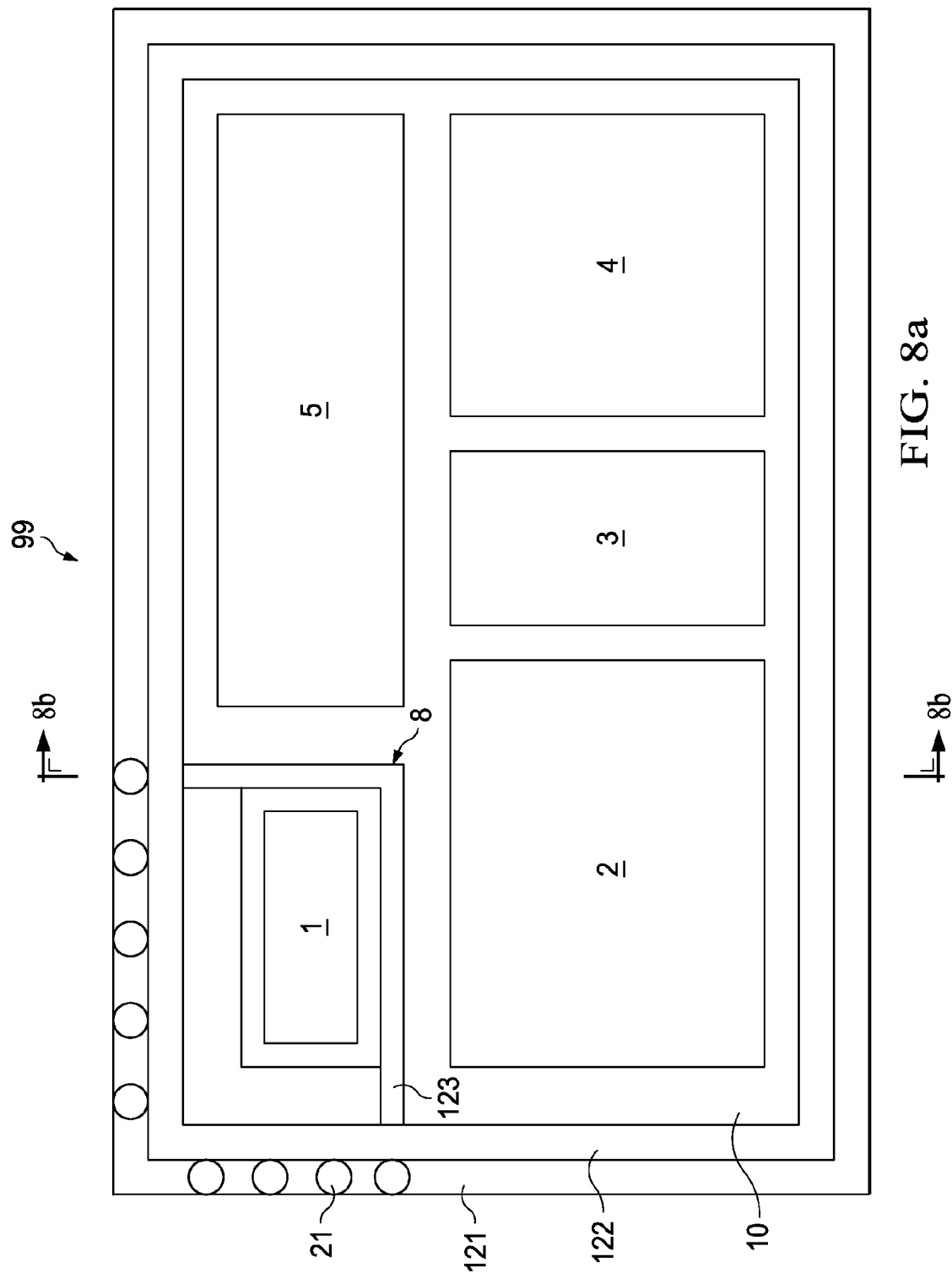
Figure 8B:
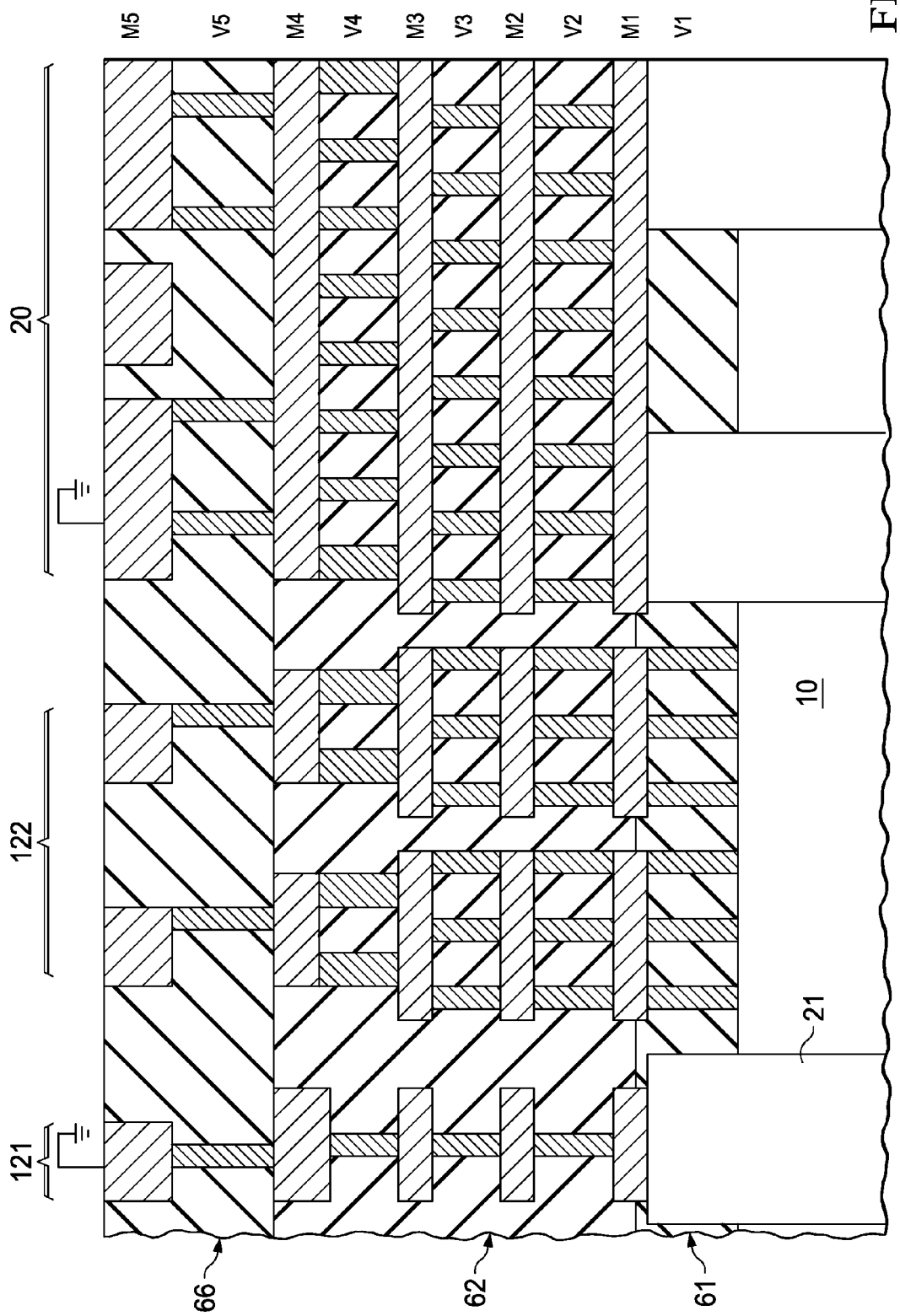

FIG. 8, which includes FIGS. 8a and 8b illustrates an embodiment of the invention illustrating through substrate vias coupled with the crack stop layer 121 of the SoC 99, wherein FIG. 8a illustrates a top view and FIG. 8b illustrates a cross sectional view. As illustrated in FIG. 8a, the crack stop layer 121 around the RF component 1 is coupled to through substrate vias 21. In various embodiments, the through substrate vias 21 are formed only adjacent the RF component 1 and not around the complete SoC 99. As illustrated the crack stop layer 121 and the interconnect RF barrier 123 are coupled to a ground potential node.

FIG. 9, which includes FIGS. 9a-9f, illustrates the metallization structure forming the interconnect RF barrier 123. The metal lines of the interconnect RF barrier 123 are formed as one or more parallel lines, for example, as illustrated in FIG. 9a. In various embodiments, the one or more parallel lines are vertically connected by an array of vias. The vias may comprise square or circular shaped minimum vias, elongated rectangular vias, interrupted or non-interrupted via bars. In various embodiments, the metal lines comprise discontinuous lines (FIG. 9b). However, the discontinuity or gap between metal lines is controlled to be with a minimum distance. This minimum distance ensures complete shielding of electromagnetic waves if the distance between neighboring metal lines is smaller than the wavelength of the RF frequency being shielded. In various embodiments, the metal lines are designed based on the expected noise of the operating RF component 1. In one embodiment, spacing between metal lines of about 100 μm or less is selected to shield RF frequencies up to 1000 GHz, while a spacing of about 10 mm or less is selected to shield RF frequencies up to 10 GHz. In some embodiments, the metal lines ($M_1$-$M_5$) of the interconnect RF barrier 123 may be formed as plates to increase shielding effect (FIG. 9c). To maximize shielding with a minimal use of metal lines, the metal line in subsequent layers are disposed in such as a way to fill any remaining gaps in the underlying or overlying metal line of the interconnect RF barrier 123. For example, in one embodiment illustrated in FIG. 9d, when the first metal lines 63 are disposed around the RF component 1 as parallel lines, the second metal lines 65 in the upper metal level are disposed between the first metal lines 63. FIG. 9e illustrates the first vias 64 formed over the first metal lines 63, in one embodiment. First vias 64 comprise filled trenches forming a long metal wall. However, in other embodiments shorter first vias 64 are formed. FIG. 9f illustrates another embodiment comprising continuous first metal lines 63 and continuous first vias 64 disposed around the RF component 1.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present invention is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor chip comprising:
    a first semiconductor circuitry including an RF circuit disposed on a first portion of a top surface of a substrate;
    a crack stop adjacent the first semiconductor circuitry, the crack stop disposed along an edge of the system on chip, wherein the crack stop is coupled to a ground potential;
    a second semiconductor circuitry disposed on a second portion of the top surface of the substrate, wherein the second semiconductor circuitry comprises no RF devices;
    an interconnect radio frequency (RF) barrier disposed between the first semiconductor circuitry and the second semiconductor circuitry, the interconnect RF barrier coupled to the ground potential.

2. The semiconductor chip of claim 1, wherein the interconnect RF barrier comprises:
    a vertical section comprising metal lines and vias, the vertical section disposed above a region of the substrate comprising no active devices; and
    a horizontal section comprising metal lines, the horizontal section disposed at least partially over the first semiconductor circuitry.

3. The semiconductor chip of claim 2, wherein the vertical section is coupled to a through substrate via disposed in the substrate.

4. The semiconductor chip of claim 2, wherein the vias comprise line segments.

5. The semiconductor chip of claim 2, wherein the metal lines are arranged in multiple rows around the first semiconductor circuitry.

6. The semiconductor chip of claim 5, wherein the metal lines are staggered between the multiple rows.

7. The semiconductor chip of claim 1, wherein the interconnect RF barrier includes openings for interconnects between the first semiconductor circuitry and the second semiconductor circuitry.

8. The semiconductor chip of claim 1, further comprising a moisture barrier adjacent the first semiconductor circuitry, the moisture barrier disposed along an edge of the system on chip, wherein the moisture barrier is coupled to a ground potential node.

9. The semiconductor chip of claim 1, further comprising a through substrate via disposed under the crack stop, wherein the crack stop is coupled to the through substrate via.

10. A semiconductor chip comprising:
    first semiconductor circuitry disposed on a first portion of a top surface of a substrate;
    a first conductive structure adjacent the first semiconductor circuitry, the first conductive structure disposed along an edge of the system on chip, wherein the first conductive structure is designed to block transmission of electromagnetic waves from and to the first semiconductor circuitry, wherein the first conductive structure comprises a crack stop or a moisture barrier; and
    a second conductive structure adjacent the first semiconductor circuitry, the second conductive structure disposed along an edge of the system on chip, wherein the second conductive structure is designed to block transmission of electromagnetic waves from and to the first semiconductor circuitry, wherein the second conductive structure comprises a crack stop or a moisture barrier, and wherein the first and the second conductive structures are different structures.

11. The semiconductor chip of claim 10, further comprising a through substrate via disposed under the first conductive structure, wherein the first conductive structure is coupled to the through substrate via.

12. The semiconductor chip of claim 10, further comprising:
    a second semiconductor circuitry disposed on a second portion of the top surface of the substrate; and
    an interconnect radio frequency (RF) barrier disposed between the first semiconductor circuitry and the second semiconductor circuitry, wherein the interconnect RF barrier blocks transmission of electromagnetic waves between the first and the second semiconductor circuitry.

13. A semiconductor chip comprising:
    A moisture barrier disposed around a substrate, wherein the moisture barrier is coupled to a ground potential node;
    A first semiconductor circuit disposed at a surface of the substrate adjacent the moisture barrier, wherein the first semiconductor circuit comprises a radio frequency (RF) circuit;
    A second semiconductor circuit disposed adjacent the RF circuit, the second semiconductor circuit including no RF circuitry; and
    An interconnect RF barrier disposed between the first semiconductor circuit and the second semiconductor circuit, the interconnect RF barrier comprising metal lines and vias, wherein the interconnect RF barrier is disposed above a part of the substrate comprising no active devices, and wherein the interconnect RF barrier is coupled to the ground potential.

14. The semiconductor chip of claim 13, wherein the interconnect RF barrier is coupled to a through substrate via disposed in the substrate.

15. The semiconductor chip of claim 13, wherein the interconnect RF barrier comprises a vertical section comprising metal lines and vias.

16. The semiconductor chip of claim 13, further comprising a top shield comprising metal lines disposed on a top most level of metallization, the top shield coupled to the interconnect RF barrier and disposed at least partially over the RF circuit.

17. The semiconductor chip of claim 13, further comprising a through substrate via coupled to the moisture barrier, the through substrate via disposed under the moisture barrier.

18. The semiconductor chip of claim 13, wherein the interconnect RF barrier shields the second semiconductor circuit from electromagnetic radiation emanating from the first semiconductor circuit.

19. A system on chip comprising:
- A conductive structure surrounding a substrate, wherein no active circuitry is disposed between the conductive structure and an edge of the substrate;
- A RF circuitry disposed in a first portion of the substrate;
- A semiconductor circuitry disposed in a second portion of the substrate, the semiconductor circuitry including no RF circuitry; and
- An interconnect RF barrier disposed between the first portion of the substrate and the second portion of the substrate and above a part of the substrate comprising no active devices, the interconnect RF barrier comprising metal lines and vias, wherein the interconnect RF barrier and the conductive structure are designed to substantially block electromagnetic radiation entering or radiating from the RF circuitry, wherein the conductive structure and the interconnect RF barrier surround substantially all of the RF circuitry.

20. The system on chip of claim 19, wherein the conductive structure comprises a crack stop and/or a moisture barrier.

21. A method of fabricating a system on chip, the method comprising:
- forming RF circuitry and non-RF circuitry in an active region of a substrate;
- forming through substrate vias in the substrate between the RF circuitry and the non-RF circuitry, wherein forming the through substrate vias comprises filling deep openings in the substrate with a conductive material;
- after forming the through substrate vias, forming a stack of metal lines and vias disposed on the through substrate via, the last metal line of the stack at least partially disposed over the RF circuitry; and
- coupling the stack of metal lines and vias and the through substrate via to a ground potential node, wherein the stack of metal lines and vias and the last metal line form an interconnect RF barrier that shields the semiconductor circuitry from electromagnetic radiation emanating from the RF circuitry.

22. The method of claim 21, wherein the substrate vias and the stack of metal lines are formed between the RF circuitry and an edge of the substrate.

23. The method of claim 21, further comprising thinning the substrate to expose the through substrate vias from the back side after forming the stack of metal lines and vias.

24. The method of claim 21, wherein forming the through substrate vias comprises forming through substrate vias spaced apart by a distance less than about 300 um.

* * * * *

UNITED STATES PATENT AND TRADEMARK OFFICE
CERTIFICATE OF CORRECTION

PATENT NO.         : 8,063,469 B2
APPLICATION NO.    : 12/242556
DATED              : November 22, 2011
INVENTOR(S)        : Hans-Joachim Barth It is certified that error appears in the above-identified patent and that said Letters Patent is hereby corrected as shown below:

In the Claims

In Col. 9, line 31, claim 1, delete "the system on chip," and insert --the semiconductor chip,--.
In Col. 9, lines 65-66, claim 8, delete "the system on chip," and insert --the semiconductor chip,--.
In Col. 10, line 9, claim 10, delete "the system on chip," and insert --the semiconductor chip,--.
In Col. 10, line 17, claim 10, delete "the system on chip," and insert --the semiconductor chip,--.

Signed and Sealed this
Twenty-sixth Day of May, 2015

Michelle K. Lee
*Director of the United States Patent and Trademark Office*